United States Patent [19]

Jun

[11] Patent Number: 5,342,800
[45] Date of Patent: Aug. 30, 1994

[54] METHOD OF MAKING MEMORY CELL CAPACITOR

[75] Inventor: Young-Kwon Jun, Seoul, Rep. of Korea

[73] Assignee: Goldstar Electron Co., Ltd., Cheongju, Rep. of Korea

[21] Appl. No.: 975,232

[22] Filed: Nov. 12, 1992

[30] Foreign Application Priority Data

Nov. 12, 1991 [KR] Rep. of Korea ............... 91-20031

[51] Int. Cl.$^5$ ................................... H01L 21/70
[52] U.S. Cl. ............................... 437/52; 437/47; 437/60; 437/919; 437/977
[58] Field of Search .............. 437/47, 48, 52, 60, 437/919, 977

[56] References Cited

U.S. PATENT DOCUMENTS

| | | | |
|---|---|---|---|
| 4,545,852 | 10/1985 | Barton | 156/643 |
| 5,023,204 | 6/1991 | Adachi et al. | 437/228 |
| 5,134,086 | 7/1992 | Ahn | 437/52 |
| 5,158,905 | 10/1992 | Ahn | 437/52 |
| 5,254,503 | 10/1993 | Kenney | 437/52 |
| 5,256,587 | 10/1993 | Jun et al. | 437/52 |

OTHER PUBLICATIONS

Electrical Characterization of Textured Interpoly Capacitors for Advanced Stacked Drams by: Pierre C. Fazan and Akram Ditali; IEDM 1990, pp. 27.5.1–27.5.4.
Rugged Surface Poly-si Electrode and Low Temperature Deposited Si3N4 for 64MBit and Beyound STC Dram Cell by: M. Yoshimaru, J. Miyano, N. Inoue, A. Kakamoto, S. You, H. Tamura and M. Ino; IEDM 1990, pp. 27.4.1–27.4.4.
A capacitor-Over-Bit-Line (COB) Cell with a Hemispherical-Grain Storage Node for 64Mb DRAMs by: M. Sakao, N. Kasai, T. Ishijima, E. Ikawa, H. Watanabe, K. Terada and T. Kikkawa; IEDM 1990; pp. 27.3.1–27.3.4.

Primary Examiner—Tom Thomas
Attorney, Agent, or Firm—Alan R. Loudermilk

[57] ABSTRACT

A method for making a memory cell capacitor is disclosed. Steps in accordance with present invention are: (1) forming a capacitor node contact hole after making necessary elements in a semiconductor substrate by depositing an insulation layer and etching a predetermined portion of the insulating layer by a photolithographic process; (2) depositing a doped polysilicon layer, thereby making a contact for connecting the capacitor electrode and a source/drain region in the semiconductor substrate; (3) depositing a silicon nitride layer and a first silicon oxide layer, and opening a window by a photolithographic process in the first silicon nitride layer and the silicon oxide layer at a position where the capacitor storage electrode is to be formed; (4) depositing a hemispherical polysilicon layer having peaks and valleys on the exposed surfaces of the polysilicon layer, the silicon nitride layer, and the first silicon oxide layer; (5) depositing a second oxide layer and etching back the second silicon oxide layer so that it selectively remains in the valleys of the hemispherical polysilicon layer; (6) forming a plurality of polysilicon projections by dry etching the hemispherical polysilicon layer and the polysilicon layer using the remaining portions of the second silicon oxide layer and the first silicon oxide layer as a mask; (7) removing the first and second silicon oxide layers by a wet etching process; (8) depositing a polyimide layer and etching back the polyimide layer so as to expose the surface of the silicon nitride layer; and (9) forming a capacitor storage electrode by removing the silicon nitride layer by a wet etching process, etching the polysilicon layer by using the polyimide layer as a mask, and removing the polyimide layer. In step (2), the doped polysilicon layer may be deposited to a thickness of about 2000 Å or more by applying a LPCVD process at a temperature of about 500° C. or more.

4 Claims, 3 Drawing Sheets

METHOD OF MAKING MEMORY CELL CAPACITOR

FIELD OF THE INVENTION

The present invention relates to memory cell capacitors and fabrication methods thereof, and in particular to a capacitor of large capacitance and improved uniformity.

BACKGROUND OF THE INVENTION

In dynamic random access memory (DRAM) fabrication technology, continuous efforts are being made to build a capacitor of larger capacitance in a smaller space.

FIGS. 1(A)–(C) illustrate one of the conventional techniques for forming a DRAM capacitor. The fabrication process of such a DRAM capacitor will be explained briefly below.

As shown in FIG. 1(A), after forming necessary elements on semiconductor substrate 1, the overall surface is coated with insulation layer 2. A contact hole for making contact between a source/drain region in semiconductor substrate 1 (not explicitly shown) and a capacitor electrode is formed by application of a photolithographic or photo-etching process to predetermined portions of insulating layer 2. Continually, doped polysilicon is deposited by a low pressure chemical vapor deposition (LPCVD) process at a temperature of about 600° C., and a portion of a capacitor storage node is patterned.

Thereafter, as shown in FIG. 1(B), hemispherical polysilicon layer 4 (which has many hemispherical domes on the surface) is deposited under the conditions of pressure of about 1.0 torr, at a temperature of about 550° C., and an ambience of SiH$_4$ (20%) gas diluted with "He" or helium gas.

A capacitor node is formed by etching back hemispherical polysilicon layer 4, such as by application of a reactive ion etching (dry type of etching) in an atmosphere of "HBr" gas, as illustrated in FIG. 1(C).

Thereafter, the capacitor is fabricated by forming a dielectric layer and a plate electrode of polysilicon.

This conventional method of increasing the surface of the capacitor node by using a hemispherical polysilicon layer typically is insufficient. That is, in the case of a hemispherical polysilicon node compared with a planar node, the increase of the surface area of the node is $2\pi r^2/\pi r^2 = 2$; it is up to about 2 at best, and it is impossible to be more.

SUMMARY OF THE INVENTION

The present invention is intended to overcome the above described limit in increasing the surface area of a capacitor electrode.

Accordingly, it is an object of the present invention to provide a method for making a memory cell capacitor which comprises the steps of: (1) forming a capacitor node contact hole after making necessary elements in semiconductor substrate 1, by depositing an insulation layer 2 on the whole surface of the wafer (semiconductor substrate 1), and etching a predetermined portion of insulating layer 2 by a photolithographic process; (2) depositing doped polysilicon layer 3, thereby making a contact for connecting the capacitor electrode and a source/drain region; (3) depositing silicon nitride layer 5 and silicon oxide layer 6, and opening window 55 by a photolithographic process on portions thereof where a capacitor storage electrode is to be formed; (4) depositing hemispherical polysilicon layer 4 having many peaks 44 and valleys 42 on exposed surfaces of polysilicon layer 3, silicon nitride layer 5, and silicon oxide layer 6; (5) depositing silicon oxide layer 62 and etching back silicon oxide layer 62 so that it remains selectively in valleys 42 of hemispherical polysilicon layer 4; (6) forming a plurality of polysilicon projections 32 from polysilicon layer 3 by dry etching hemispherical polysilicon layer 4 and polysilicon layer 3, using the remaining portions of silicon oxide layer 62 as a mask; (7) removing silicon oxide layers 6 and 62 by a wet etching process; (8) depositing polyimide layer 7 and etching back polyimide layer 7 so as to expose the surface of silicon nitride layer 5; and (9) forming capacitor storage electrode 36 by removing silicon nitride layer 5 by a wet etching process, etching polysilicon layer 3 using polyimide layer 7 as a mask, and removing polyimide layer 7. In step (2), doped polysilicon layer 3 is deposited to a thickness of about 2000 Å or more, by applying a LPCVD process at a temperature of about 500° C. or more. In step (4), the hemispherical polysilicon deposition process is carried out under conditions of an atmosphere of SiH$_4$ gas, and a pressure of about 0.1–10 torr at a temperature of about 560°–600° C., and the thickness of hemispherical polysilicon layer 4 is about 1000 Å, or, alternatively, the hemispherical polysilicon deposition process is carried out under conditions of an atmosphere of Si$_2$H$_6$ gas, and a pressure of about 0.1–1 torr at a temperature of about 570°–610° C., and the thickness of hemispherical polysilicon layer 4 is about 1000 Å.

Another object of the present invention is to provide a memory cell capacitor comprising a cylindrical capacitor storage node which is located above a capacitor node contacted with a source/drain region, the cylindrical capacitor storage node having a plurality of projections standing vertically upward from the substrate.

BRIEF DESCRIPTION OF THE DRAWINGS

The above object and other advantages of the present invention will become more apparent by describing in detail the preferred embodiments of the present invention with reference to the attached drawings in which.

DESCRIPTION OF THE PREFERRED EMBODIMENTS

Figure 1A:
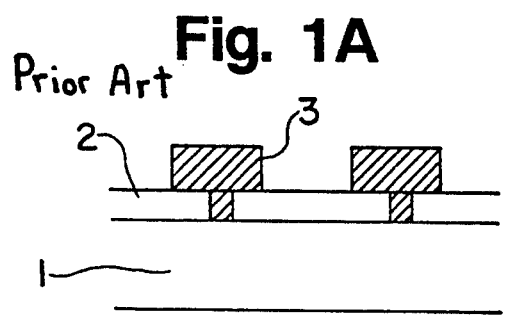
FIGS. 1(A) to (C) are sectional views of a memory cell portion of a wafer for illustrating the steps of a conventional fabrication method.
Figure 1B:
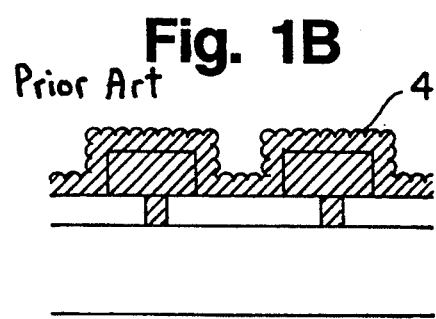
Figure 1C:
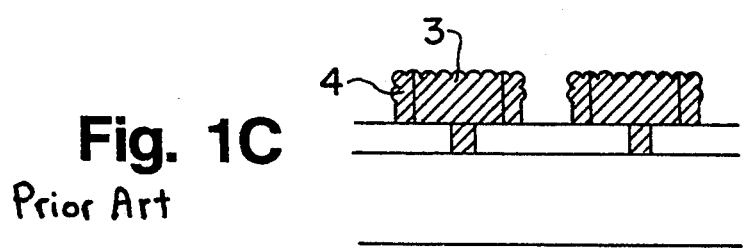
Figure 2A:
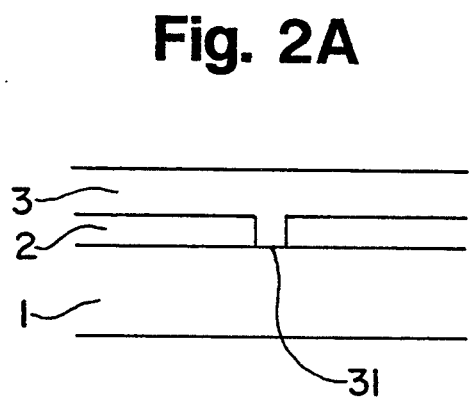
FIGS. 2(A) to (I) are sectional views of a memory cell portion of a wafer for illustrating the steps of a fabrication method in accordance with the present invention.

As shown in FIG. 2(A), after making necessary elements such as source/drain regions in semiconductor substrate 1, the overall surface is coated with insulation layer 2, and contact hole 31 for making contact between a source/drain region (not explicitly shown) and a capacitor electrode is formed by application of a photolithographic or photo-etching process to predetermined portions of insulating layer 2.

Next, doped polysilicon layer 3 is deposited to a thickness of about 2000 Å or more, by application of a LPCVD process at a temperature of about 500° C. or more.

Figure 2B:
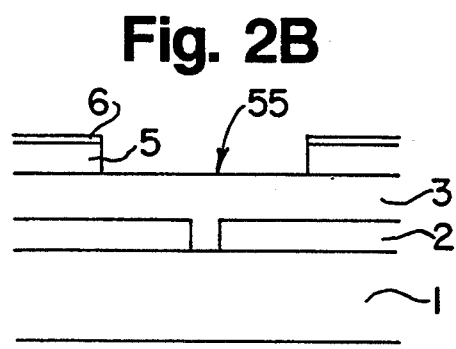
Figure 2C:
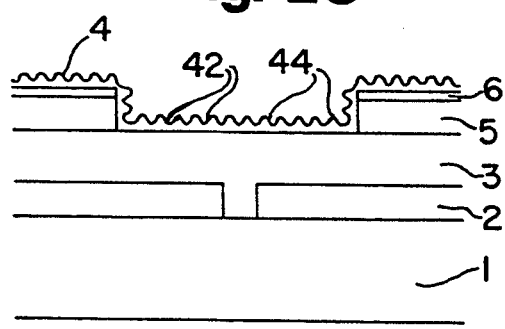

Thereafter, as shown in FIG. 2(B), silicon nitride layer 5 and silicon oxide layer 6 are deposited, and window 55 is opened by a conventional photolithographic process in portions of silicon nitride layer 5 and silicon oxide layer 6 where a capacitor storage electrode (or node) is to be formed.

Next, hemispherical polysilicon layer 4 having many peaks 44 and valleys 42 is deposited on the exposed surfaces of polysilicon layer 3, silicon nitride layer 6, and silicon oxide layer 5, to a thickness of about 1000 Å.

In accordance with preferred embodiments of the present invention, the hemispherical polysilicon deposition process is carried out under conditions of either:

(i) in an atmosphere of $SiH_4$, a pressure of about 0.1–10 torr, at a temperature of about 560°–600° C.; or (ii) in an atmosphere of $Si_2H_6$, a pressure of about 0.1–1 torr, at a temperature of about 570°–610° C.

Figure 2D:
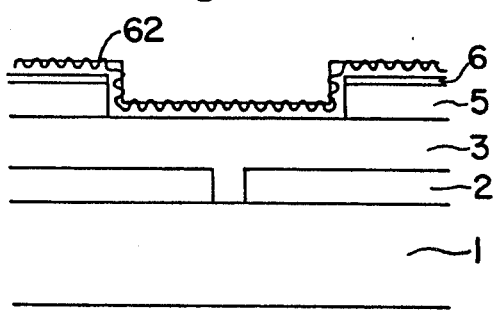

Thereafter, CVD oxide layer 62 is deposited to a thickness of about 200–1000 Å and etched back so as to remain selectively in valleys 42 of hemispherical polysilicon layer 4 as shown in FIG. 2(D).

Figure 2E:
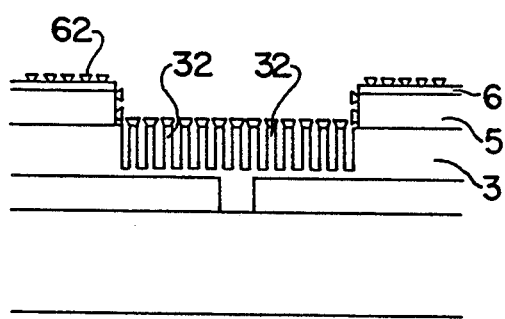

Next, as shown in FIG. 2(E), a plurality of cylindrical polysilicon projections 32 are formed by applying a dry etching process on hemispherical polysilicon layer 4 and polysilicon layer 3, using the remaining portions of silicon oxide layer 62 as a mask. Cylindrical polysilicon projections 32 are located above the capacitor node contact with a source/drain region (not explicitly shown), and comprise a plurality of projections projecting vertically upward from the plane of polysilicon layer 3 as illustrated in FIG. 2(E).

Figure 2F:
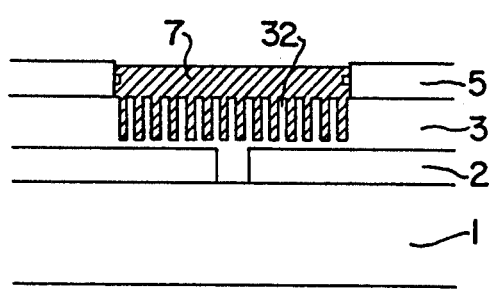

In succession, as shown in FIG. 2(F), after removing the remaining portions of silicon oxide layers 6 and 62 by a wet etching process, polyimide layer 7 is deposited and etched back so as to expose the surface of silicon nitride layer 5. Polyimide layer 7 has a large etching selectivity, which means a large etch rate difference as compared with silicon nitride layer 5 and polysilicon layer 3.

Figure 2G:
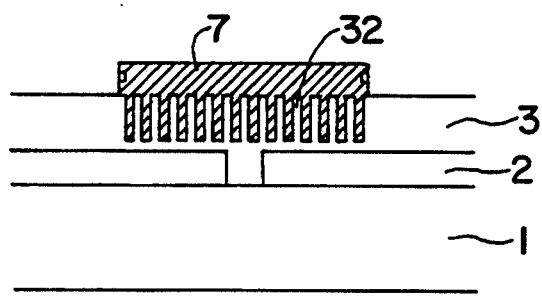

Thereafter, as shown in FIG. 2(G), the silicon nitride layer 5 is removed by a wet etching process.

Figure 2H:
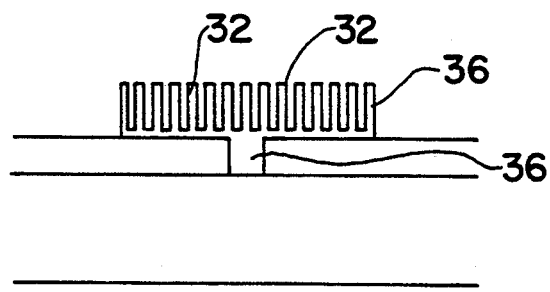
Figure 2I:
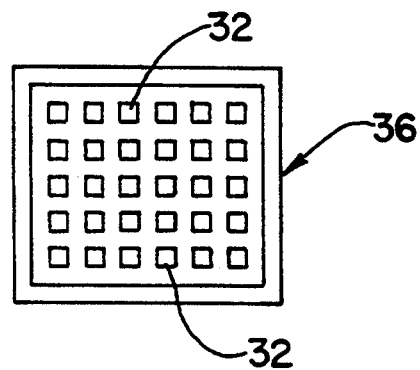

Next, as shown in FIG. 2(H), polysilicon layer 3 is etched using polyimide layer 7 as a mask so as to form a capacitor storage electrode, and polyimide layer 7 is removed. As a result, capacitor storage node 36 is formed as illustrated in FIG. 2(H).

Thereafter a capacitor is fabricated by forming a dielectric layer and a plate electrode of polysilicon (not shown) in a conventional manner.

FIG. 2 (I) illustrates an example of a capacitor layout made by a process in accordance with the present invention. The cylindrical capacitor storage node of this invention is located above a capacitor node contact with a source/drain region in the substrate, and the cylindrical capacitor storage node has a plurality of cylindrical projections projecting vertically upward from the substrate.

With a structure of a capacitor node in accordance with present invention, the capacitor node is of a cylindrical shape having many cylindrical projections formed on the upper side of the node contact. Therefore, the surface area of the capacitor node typically should be much increased over prior techniques.

Although various preferred embodiments of the present invention have been disclosed for illustrative purposes, those skilled in the art will appreciate that various modifications, additions and/or substitutions are possible without departing from the scope and spirit of the present invention as disclosed in the claims.

What is claimed is:

1. A method for making a memory cell capacitor having a capacitor storage electrode connected to a source/drain region in a semiconductor substrate, comprising the steps of:

(1) depositing an insulation layer on the semiconductor substrate and etching a predetermined portion of the insulating layer to form a capacitor node contact hole for contact with the source/drain region;

(2) depositing a doped polysilicon layer, wherein the doped polysilicon layer is connected to the source/drain region through the capacitor node contact hole;

(3) depositing a silicon nitride layer and a first silicon oxide layer, and opening a window in the silicon nitride layer and the first silicon oxide layer at a position where the capacitor storage electrode is to be formed;

(4) depositing a hemispherical polysilicon layer having peaks and valleys on the exposed surfaces of the polysilicon layer, the silicon nitride layer, and the first silicon oxide layer;

(5) depositing a second silicon oxide layer and etching back the second silicon oxide layer, wherein the second silicon oxide layer selectively remains in the valleys of the hemispherical polysilicon layer;

(6) forming a plurality of polysilicon projections by etching the hemispherical polysilicon layer and the polysilicon layer, wherein the remaining portions of the second silicon oxide layer serve as a mask;

(7) removing the first and second oxide layers;

(8) depositing a polyimide layer and etching back the polyimide layer so as to expose the surface of the silicon nitride layer;

(9) forming a capacitor storage electrode by removing the silicon nitride layer, etching the polysilicon layer wherein the polyimide layer serves as a mask, and removing the polyimide layer; and

(10) forming a dielectric layer on the capacitor storage electrode, and forming a capacitor plate electrode on the dielectric layer.

2. The method as claimed in claim 1, wherein in step (2), the doped polysilicon layer is deposited to a thickness of about 2000 Å or more by applying an LPCVD process at a temperature of about 500° C. or more.

3. The method as claimed in claim 1, wherein in step (4), the step of depositing the hemispherical polysilicon layer is performed in an atmosphere of $SiH_4$ gas, at a pressure of about 0.1–10 torr and at a temperature of about 560°–600° C., and the thickness of the hemispherical polysilicon layer is about 1000 Å.

4. The method as claimed in claim 1, wherein in step (4), the step of depositing the hemispherical polysilicon layer is performed in an atmosphere of $Si_2H_6$ gas, at a pressure of about 0.1–1 torr and at a temperature of about 570°–610° C., and the thickness of the hemispherical polysilicon layer is about 1000 Å.

* * * * *